(12) United States Patent
Chu et al.

(10) Patent No.: US 6,215,546 B1
(45) Date of Patent: Apr. 10, 2001

(54) METHOD OF OPTICAL CORRECTION FOR IMPROVING THE PATTERN SHRINKAGE CAUSED BY SCATTERING OF THE LIGHT

(75) Inventors: Ronfu Chu, Taipei; Quentin Chen, Tainan; Chungwei Hsu, Taipei; Jengping Lin, Taoyuan, all of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/541,581

(22) Filed: Apr. 3, 2000

(30) Foreign Application Priority Data

Apr. 19, 1999 (TW) .................................. 88106207

(51) Int. Cl.$^7$ .......................... G03B 27/42; G03B 27/72; G03H 1/00; G02F 1/15; G03C 5/00

(52) U.S. Cl. .............................. 355/52; 355/53; 355/71; 359/30; 359/265; 359/273; 359/582; 359/299; 430/24; 430/311; 430/314

(58) Field of Search ................... 355/52, 53, 71; 359/30, 265, 273, 582, 299; 430/24, 311, 314

(56) References Cited

U.S. PATENT DOCUMENTS

| | | | |
|---|---|---|---|
| 5,308,991 | * 5/1994 | Kaplan | 250/492.22 |
| 5,324,600 | * 6/1994 | Jinbo et al. | 430/5 |
| 5,546,225 | * 8/1996 | Shiraishi | 359/559 |
| 5,789,124 | * 8/1998 | Todd | 430/30 |
| 5,955,221 | * 9/1999 | Sanders et al. | 430/2 |
| 6,140,020 | * 10/2000 | Cummings | 430/296 |

* cited by examiner

Primary Examiner—Russell Adams
Assistant Examiner—Khaled Brown
(74) Attorney, Agent, or Firm—Darby & Darby

(57) ABSTRACT

The present invention discloses a method of optical correction for improving the pattern shrinkage caused by scattering of the light during photolithography processes, wherein the patterns on photomasks are corrected by providing aid patterns. Therefore, serifs or hammerheads are not necessary, and the costs can be decreased. According to the present invention, a chrome aid block is provided between the edges of the patterns. It is noted that the size of the chrome aid block is between ⅓ to ½ the wavelength of light used during exposure. Therefore, the pattern shrinkage caused by scattering of the light during exposure can be reduced, and there is no additional block formed on the photoresist layer. In addition, the standing wave effect can be prevented; thus, the pattern transfer is more accurate.

6 Claims, 3 Drawing Sheets

METHOD OF OPTICAL CORRECTION FOR IMPROVING THE PATTERN SHRINKAGE CAUSED BY SCATTERING OF THE LIGHT

BACKGROUND OF THE INVENTION

1. Field of the Invention

The present invention relates to an improvement of photolithography processes, and more particularly to a method of optical correction for improving the pattern shrinkage caused by scattering of the light.

2. Description of the Related Art

Photolithography processes include an exposure step in which a desired pattern is transferred onto a photoresist coated on a substrate by use of a photomask. The photoresist is removed selectively depending on the intensity of the light imaged thereon. When the optical path of light passing through the photomask deviates from the desired optical path, the pattern size obtained on the photoresist does not correspond to the size of the pattern on the photomask. This is known as the proximity effect.

The proximity effect can be partially compensated by amending the patterns on the photomask. For example, if it is known that an image formed on a photoresist layer is narrower than the pattern on the photomask, the pattern on the photomask may be designed wider than the desired size of the image. Data sets of photomasks used in a photolithography process, including amendments, can be stored as a database in a computer and accessed by different users.

In addition, pattern shrinkage caused by scattering of the light during the exposure step is also a problem, especially when the size of devices is tiny, for example, 0.5 microns or even less than 0.25 microns. Referring to FIG. 1, a top view of the pattern shrinkage after photolithography processes is shown. In the left side of FIG. 1, the length of pattern 10 on a photomask is b, and the distance between the edges of the two patterns 10 is a. The patterns transferred onto a photoresist layer by photolithography are shown in the right side of FIG. 1, which is marked 12. Because of the effect of scattering of the light at the opaque edges of the photomask during exposure, the length of patterns on the photoresist layer is shortened from b to b', i.e. b>b'.

Methods have been developed to solve the problems caused by scattering of light. For example, serifs or hammerheads are added in the edges of the patterns on photomasks so that the areas of the patterns are larger than before. Thus, the exposed area on photoresist is decreased, and the pattern shrinkage phenomenon caused by scattering of the light is therefore reduced. The 'serif' represents a small block added on the center or the edges of the patterns, while the 'hammerhead' represents a connection (fusion) of two serifs.

Referring to FIG. 2, a top view of a corrected pattern on a photomask after photolithography processes is shown. First, patterns 10 are formed on a photomask (not shown). In addition, serifs 15 or hammerheads 17 are added to the edges of the patterns 10 as shown in FIG. 2. The patterns are transferred onto a photoresist layer (not shown) by photolithography processes so that an accurate patterns 12 are formed. As described above, the serifs 15 or hammerheads 17 are added to the edges of the patterns 10 on a photomask so that the areas of the patterns on the photomask are larger than before. Thus, the exposed area on photoresist is decreased, and the pattern shrinkage phenomenon caused by scattering of the light is therefore reduced. Accordingly, the length b of the pattern on the photomask equals to the length b' of the pattern on the photoresist layer, i.e. b=b'.

However, the formation of these photomasks as described above is complicated because the additional serifs or the hammerheads must be formed individually by electron beams. If there are many serifs or hammerheads needed in a photomask, the time or the money for fabricating a photomask is increased. Furthermore, it is observed from results of experiments that when the space between two patterns is close to a multiple of the wavelength, a standing wave effect can occur. This makes the patterns formed on the photoresist wavy. Further, the use of serifs or hammerheads does not entirely resolve the scattering of the light.

SUMMARY OF THE INVENTION

Accordingly, an object of the present invention is to provide a method of optical correction for improving the pattern shrinkage caused by scattering of the light in which patterns transferred in photolithography processes are more precise, and the complexity of the optical correction is simplified so that the efficiency of forming photomasks is higher, and the cost is decreased.

Another object of the present invention is to provide a method of optical correction for improving the pattern shrinkage caused by scattering of the light in which the standing wave effect is prevented, and the pattern transfer is more accurate.

To achieve the objects described above, the present invention discloses a method of optical correction, wherein the patterns on photomasks are corrected by providing aid patterns. Therefore serifs or hammerheads are not necessary, and the processes and cost can also be decreased. According to the present invention, a chrome aid block is provided between the edges of the patterns. It is noted that the size of the chrome aid block is between ⅓ to ½ wavelength of light used in the process. Therefore, the pattern shrinkage caused by scattering of the light during exposure can be reduced, and there is no additional block formed on the photoresist layer. In addition, the standing wave effect can be prevented so that the pattern transfer is more accurate.

The present invention provides a method of optical correction for improving the pattern shrinkage caused by scattering of the light, comprising the steps of: providing a plurality of patterns on a photomask, wherein the plurality of patterns have at least two adjacent patterns, and a gap a between the edges of the two adjacent patterns is less than or equal to quintuple the wavelength λ of the light used during exposure (a≦5λ); and providing a chrome aid block between the edges of the two adjacent patterns, wherein the location and the size of the chrome aid block correspond to the equations:

$$\begin{cases} \frac{1}{3}\lambda \leq x = y \leq \frac{1}{2}\lambda \\ d + \frac{1}{2}y = \frac{1}{2}a \end{cases},$$

wherein the symbol d represents the distance between the edges of the chrome aid block and the pattern, and the symbols x and y represent the lengths of the block perpendicular and parallel to the gap a, respectively. Thereby, the scattering of the light and standing wave effect are reduced so that the pattern shrinkage can be prevented, and the pattern transfer is effective.

The present invention also provides a method of optical correction for improving the pattern shrinkage caused by scattering of the light, comprising the steps of: providing a plurality of patterns on a photomask, wherein the plurality of patterns have at least two adjacent patterns, and a gap a between the edges of the two adjacent patterns is greater than quintuple the wavelength λ of the light used during exposure (a>5λ); and providing chrome aid blocks adjacent to the edges of the two adjacent patterns, wherein the location and the size of the chrome aid blocks correspond to the equations:

$$\begin{cases} \frac{1}{3}\lambda \le x = y \le \frac{1}{2}\lambda \\ \frac{1}{4}\lambda < d < 2\lambda \end{cases},$$

wherein the symbol d represents the distance between the edges of the chrome aid block and the adjacent pattern, and the symbols x and y represent the lengths of the block perpendicular and parallel to the gap a, respectively. Thereby, the scattering of the light and standing wave effect is reduced so that the pattern shrinkage can be prevented, and the pattern transfer is effective.

BRIEF DESCRIPTION OF THE DRAWINGS

These and other features of the present invention will now be described in detail with reference to the accompanying drawings, in which.

DETAIL DESCRIPTION OF THE PREFERRED EMBODIMENT

Embodiment 1

Figure 1:
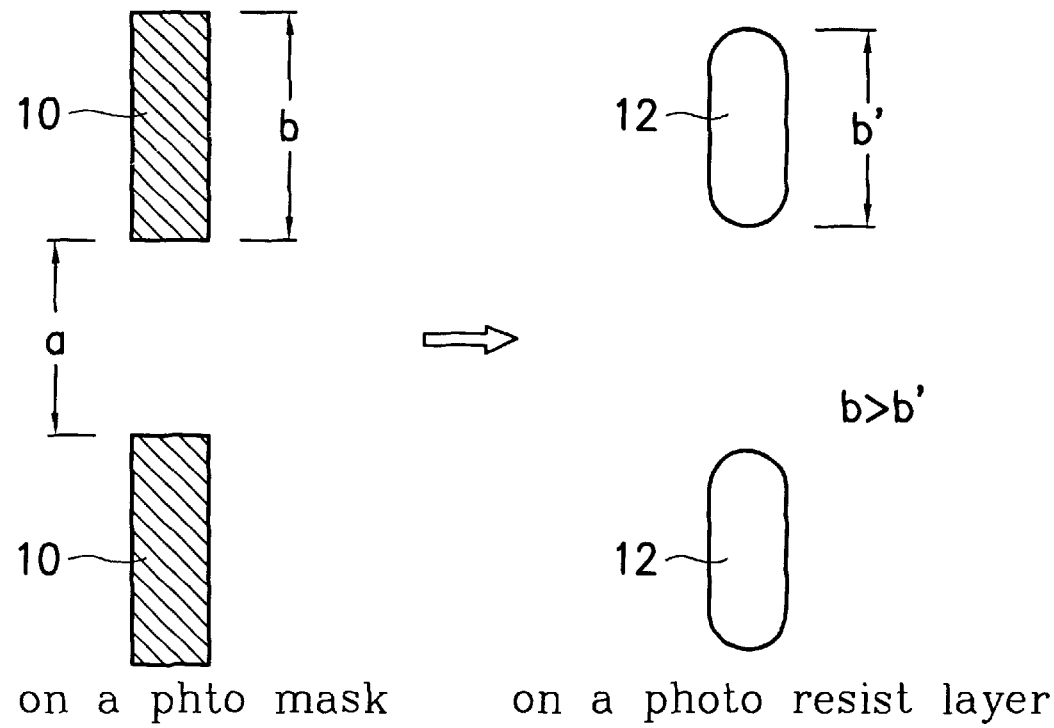
FIG. 1 is a top view of a conventional pattern shrinkage in photolithography processes, wherein the left side of the figure shows the patterns on a photomask, and the right side of the figure shows the patterns on a photoresist layer.
Figure 2:
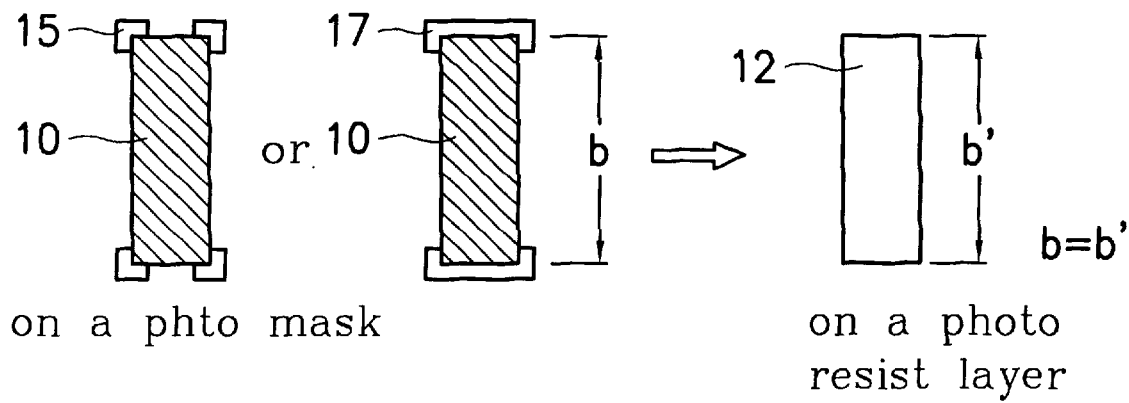
FIG. 2 is a top view of an amended pattern using serifs or hammerheads in photolithography processes, wherein the left side of the figure shows the patterns on a photomask, and the right side of the figure shows the patterns on a photoresist layer.
Figure 3:
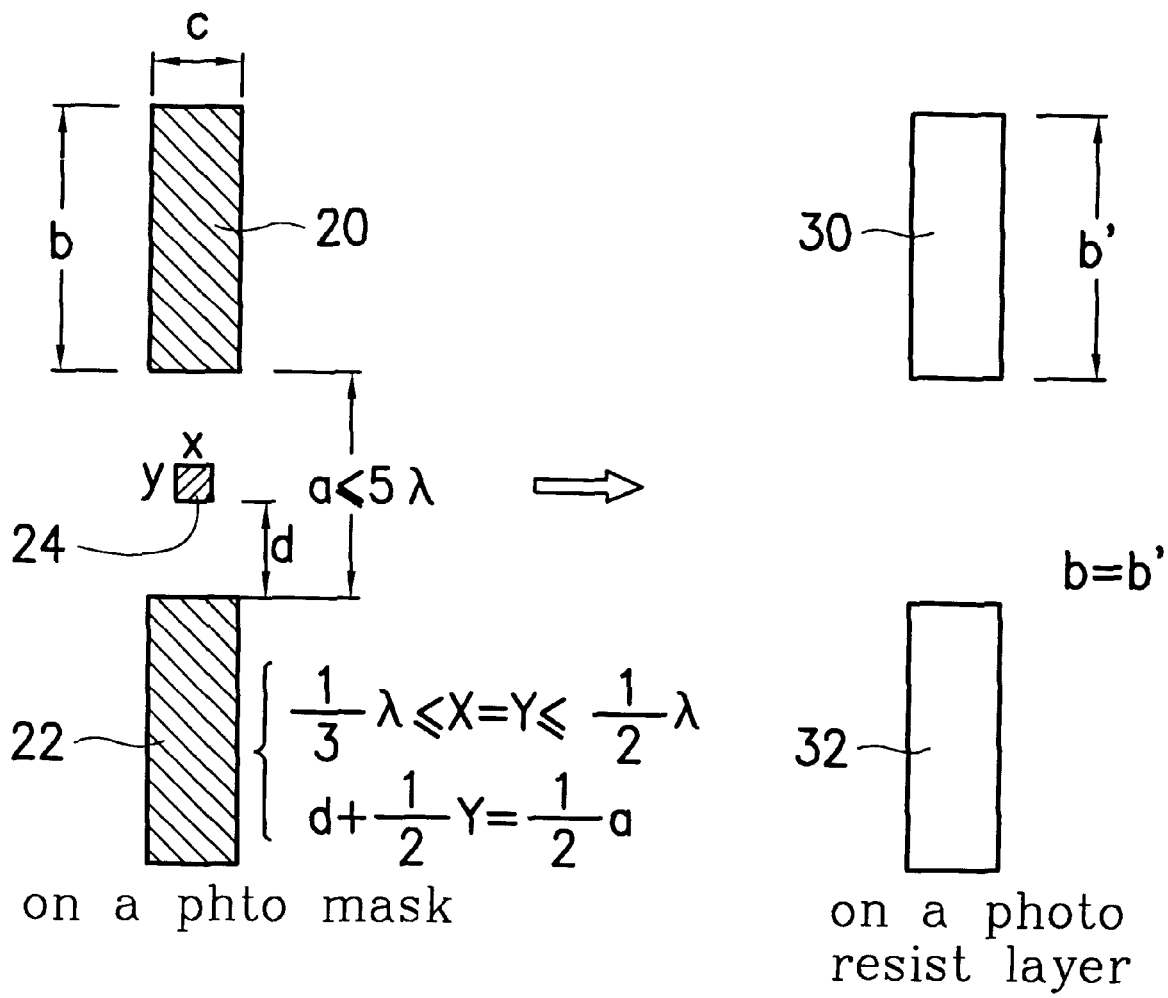
FIG. 3 is a top view of patterns in one embodiment according to the present invention (a≦5λ)

Refer to FIG. 3, wherein a top view of patterns in a preferred embodiment is illustrated. As shown in the left side of FIG. 3, patterns are formed on a photomask, for example, a quartz glass plate (not shown). For convenience, the patterns 20 and 22 are illustrated, wherein the gap between the edges of the adjacent patterns 20 and 22 is a, and the lengths parallel and perpendicular to the gap a respectively are represented by b and c in the pattern 20.

The optical correction according to the present invention will now be presented. It is noted that in this embodiment, the gap a between the edges of the adjacent patterns 20 and 22 is less than or equal to quintuple the wavelength λ of light used during exposure (a≦5λ). Instead of the serifs or hammerheads used in prior art, an opaque chrome aid block 24 is added between the edges of the patterns 20 and 22 in the present invention. Thus, scattering of the light between the pattern 20 and 22 is reduced, and the pattern shrinkage is prevented. As shown in the right side of FIG. 3, the patterns 30 and 32 in the photoresist layer are defined accurately during the photolithography processes. That is, the length b' in pattern 30 equals to the length b in pattern 20, i.e. b'=b.

The effect of the optical correction is determined by the size and location of the chrome aid block 24. Basically, the size of the chrome aid block 24 must be large enough to block the scattering of the light. However, the size of the block 24 is limited because a large block might lead to the formation of an additional block pattern in the photoresist layer. According to the results of the experiments done by inventors, the size of the block 24 is ideally between ⅓ to ½ the wavelength λ of the light used during exposure. In addition, the location of the block 24 is ideally centered between the two patterns 20 and 22. In other words, the location and the size of the chrome aid block correspond to the equations:

$$\begin{cases} \frac{1}{3}\lambda \le x = y \le \frac{1}{2}\lambda \\ d + \frac{1}{2}y = \frac{1}{2}a \end{cases},$$

wherein the symbol d represents the distance between the edges of the chrome aid block and the adjacent pattern, and the symbols x and y represent the lengths of the block perpendicular and parallel to the gap a, respectively.

Experiments indicated that shrinkage caused by scattering of the light was reduced by the optical correction according to the present invention. Furthermore, there was no additional block pattern formed in the photoresist layer. Additionally, the chrome aid block 24 prevented the occurrence of the standing wave effect, making the pattern transfer more effective.

Embodiment 2

Figure 4:
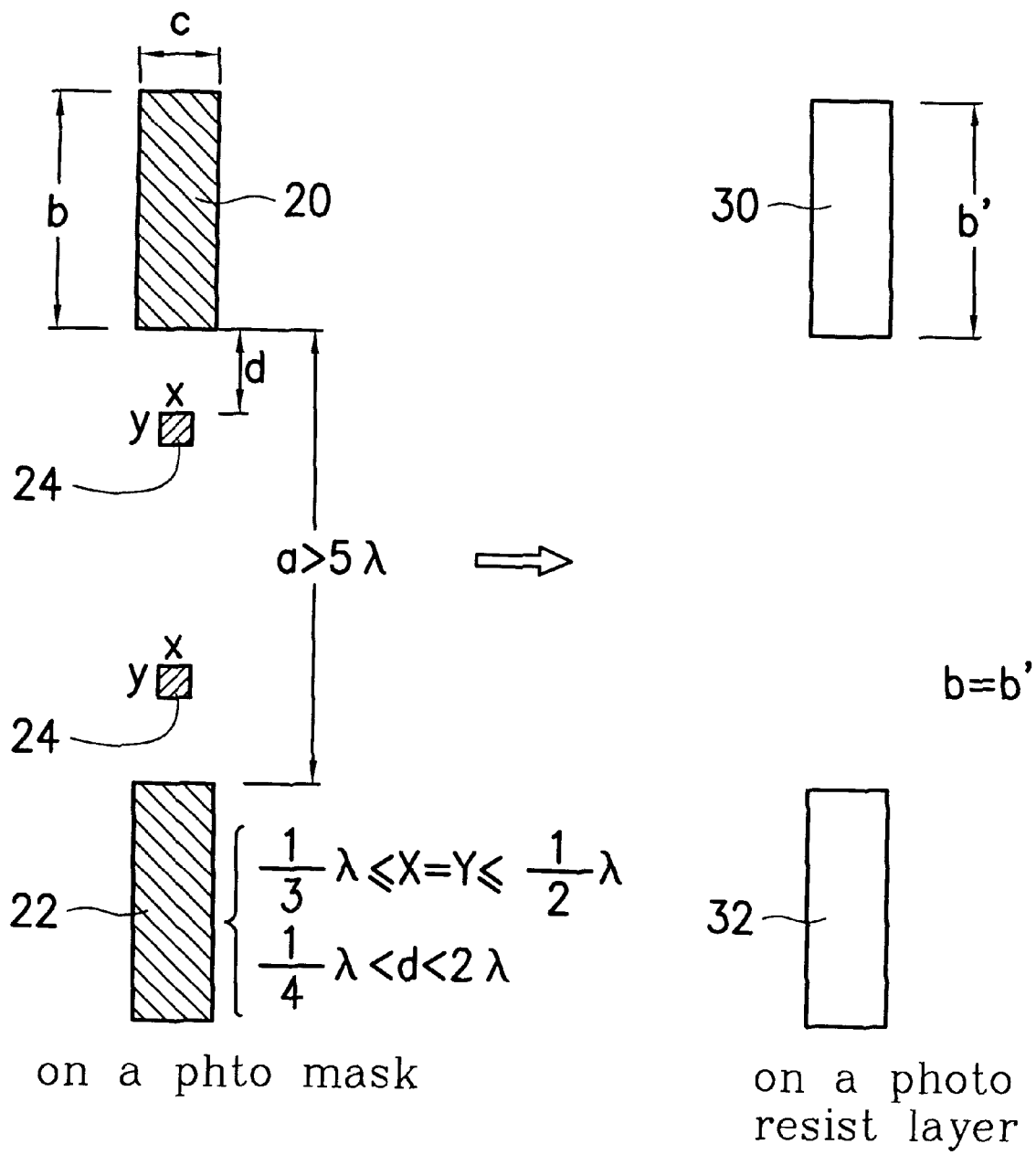
FIG. 4 is a top view of patterns in the other embodiment according to the present invention (a>5λ).

Refer to FIG. 4, wherein a top view of patterns in another preferred embodiment is illustrated. As shown in the left side of FIG. 4, patterns are formed on a photomask, for example, a quartz glass plate (not shown). For convenience, the patterns 20 and 22 are illustrated, wherein the gap between the edges of the adjacent patterns 20 and 22 is a, and the lengths parallel and perpendicular to the gap a respectively are represented by b and c in the pattern 20.

The optical correction according to the present invention will now be presented. It is noted that in this embodiment, the distance a between the edges of the patterns 20 and 22 is greater than quintuple the wavelength λ of light used during exposure (a>5λ). As opposed to the embodiment 1, a pair of opaque chrome aid blocks 24 are added adjacent to the edges of the patterns 20 and 22 respectively. The distance between the block 24 and the pattern 20 (or pattern 22) is represented by d. Thus, scattering of the light between the pattern 20 and 22 is reduced, and the pattern shrinkage is prevented. As shown in the right side of FIG. 4, by performing the photolithography processes using the photomasks according to the embodiment, the patterns 30 and 32 in a photoresist layer are defined accurately. That is, the length b' in pattern 30 equals to the length b in pattern 20, i.e. b'=b.

The effect of the optical correction is determined by the size and location of the chrome aid blocks 24. Basically, the size of the chrome aid blocks 24 must be large enough to block scattering of the light. However, the size of the block 24 is limited because if the size is too large, additional block patterns might be formed in the photoresist layer. According to the results of the experiments done by the inventors, the size of the blocks 24 is ideally between ⅓ to ½ the wavelength λ of the light used during exposure. In addition, the distance between the block 24 and the pattern 20 (or pattern 22) is ideally between ¼ to 2 the wavelength. In other words, the location and the size of the chrome aid block correspond to the equations:

$$\begin{cases} \frac{1}{3}\lambda \le x = y \le \frac{1}{2}\lambda \\ \frac{1}{4}\lambda < d < 2\lambda \end{cases},$$

wherein the symbol d represents the distance between the edges of the chrome aid block and the adjacent pattern, and the symbols x and y represent the lengths of the block perpendicular and parallel to the gap a, respectively.

Experiments indicated that the shrinkage caused by scattering of the light was reduced by the optical correction according to the present invention. Furthermore, there were no additional block patterns formed in the photoresist layer. Additionally, the chrome aid blocks 24 prevented the occurrence of standing wave effect, so the pattern transfer was more effective.

While the present invention has been described and illustrated herein with reference to the preferred embodiment thereof, it will be understood by those skilled in the art that various changes in the form and details may be made without departing from the spirit and the scope of the invention.

What is claimed is:

1. A method of optical correction for improving pattern shrinkage caused by scattering of light, comprising the steps of:

providing a plurality of patterns having edges on a photomask, wherein the plurality of patterns have at least two adjacent patterns, and a gap a between the edges of the two adjacent patterns is less than or equal to quintuple a wavelength $\lambda$ of the light used during exposure (a≦5λ); and providing a chrome aid block between the edges of the two adjacent patterns, wherein location and size of the chrome aid block correspond to equations:

$$\begin{cases} \frac{1}{3}\lambda \le x = y \le \frac{1}{2}\lambda \\ d + \frac{1}{2}y = \frac{1}{2}a \end{cases},$$

wherein the symbol d represents a distance between the edges of the chrome aid block and the pattern, and the symbols x and y represent lengths of the block perpendicular and parallel to the gap a, respectively.

2. The method as claimed in claim 1, wherein the wavelength $\lambda$ is lower than 0.5 microns.

3. The method as claimed in claim 2, wherein the wavelength $\lambda$ is lower than 0.25 microns.

4. A method of optical correction for improving pattern shrinkage caused by scattering of light, comprising the steps of:

providing a plurality of patterns having edges on a photomask, wherein the plurality of patterns have at least two adjacent patterns, and a gap a between the edges of the two adjacent patterns is greater than quintuple a wavelength $\lambda$ of the light used during exposure (a>5λ); and providing chrome aid blocks adjacent to the edges of the two adjacent patterns, wherein location and size of the chrome aid blocks correspond to equations:

$$\begin{cases} \frac{1}{3}\lambda \le x = y \le \frac{1}{2}\lambda \\ \frac{1}{4}\lambda < d < 2\lambda \end{cases}$$

wherein the symbol d represents a distance between the edges of the chrome aid block and the adjacent pattern, and symbols x and y represent the lengths of the block perpendicular and parallel to the gap a, respectively.

5. The method as claimed in claim 1, wherein the wavelength $\lambda$ is lower than 0.5 microns.

6. The method as claimed in claim 2, wherein the wavelength $\lambda$ is lower than 0.25 microns.

* * * * *